(12) United States Patent
Ma

(10) Patent No.: US 6,485,320 B1
(45) Date of Patent: Nov. 26, 2002

(54) LAND GRID ARRAY CONNECTOR ASSEMBLY

(75) Inventor: Hao-Yun Ma, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/027,706

(22) Filed: Dec. 19, 2001

(51) Int. Cl.⁷ ............................................. H01R 13/625
(52) U.S. Cl. ...................................................... 439/342
(58) Field of Search ................................. 439/342, 259

(56) References Cited

U.S. PATENT DOCUMENTS 5,640,303 A * 6/1997 Hooley ........................ 439/331
6,045,370 A * 4/2000 Treibergs et al. ............. 439/73
6,244,875 B1 * 6/2001 McHugh et al. .............. 439/73

* cited by examiner

Primary Examiner—Gary Paumen
(74) Attorney, Agent, or Firm—Wei Te Chung

(57) ABSTRACT

A land grid array connector assembly (1) comprises a socket (11) and a fastening device (10) surrounding the socket. The fastening device includes an insulative frame (13), a lever (12) and a metal clip (14) respectively assembled to a first and a second side of the frame. The lever is pivotally assembled to the first side of the frame, the clip is movably mounted to the second side of the frame, and the clip has a pair of acting portions (141) respectively received in a pair of locating grooves (15) of the frame. Each locating groove has a horizontal portion (151) and an arced portion (152) connected with the horizontal portion. The acting portion rotates in the arced portions of the locating grooves and slides in horizontal portions of the locating grooves.

11 Claims, 5 Drawing Sheets

LAND GRID ARRAY CONNECTOR ASSEMBLY

BACKGROUND OF THE INVENTION

1. Field of the Invention

The present invention relates to the art of electrical connectors, and more particularly to a land grid array connector assembly having a fastening device for securing a central processing unit (CPU) therein.

2. Description of the Prior Art

A conventional land grid array connector assembly 6, as shown in FIG. 8, commonly includes a fastening device 60 and a socket 61 received in the device 60. The fastening device 60 comprises a quadrate frame 63, a lever 62 and a metal clip 64 respectively mounted to opposite sides of the frame 63. The frame defines a pair of locating slots 66 at one side thereof and a pair of guiding grooves 65 at another opposite side thereof. Each guiding groove 65 has a first inner wall 651 and a second inner wall 652. The lever 62 has a pair of locating portions 623 pivotally positioned in locating slots 66 of the frame 63, a driving portion 621 defined between the locating portions 623, and a handling portion 622 bending vertically from one of the locating portions 623. The clip 64 has a pair of securing portion 641 movably received in the guiding grooves 65 of the frame 63 and a driving hook 644 defined at a free end thereof.

In use, the clip 64 is firstly set up perpendicular to the frame 63 with the securing portion 641 pressing close to the first inner walls 651 of the guiding grooves 65, a CPU 7, together with a copper plate 8 which functions as a heat dissipation device, is assembled on the socket 61. Then, the clip 64 is rotated to a parallel position and abuts against the copper plate 8. However, as can be seen from FIG. 9, during the rotation of the clip 64, the clip 64 may simultaneously move along the guiding grooves 65 towards the second inner wall 652 which leads to the driving hook 644 of the clip 64 extending beyond its correct position. As a result, when rotating the handling portion 622 of the lever 62, the driving portion 621 of the lever 62 cannot slide into the driving hook 644 of the clip 64 and drive it, which leads to the clip 64 can not reach its final pressing position. Thus, the clip 64 fails to locate the CPU 7 and the copper plate 8 securely.

SUMMARY OF THE INVENTION

Accordingly, an object of the present invention is to provide a land grid array connector assembly having a fastening device for retaining a central processing unit (CPU) securely in the connector assembly.

Another object of the present invention is to provide a fastening device for a land grid array socket to fasten a CPU in the land grid array socket.

In order to achieve the objects set forth, a land grid array connector assembly in accordance with the present invention includes a socket and a fastening device surrounding the socket. The fastening device comprises a frame having a first side and a second side opposite to the first side, a lever pivotally mounted to the first side of the frame, and a metal clip movably mounted to the second side of the frame.

The frame includes a pair of locating slots defined at opposite ends of the first side and a pair of locating grooves defined at opposite ends of the second side, each locating groove has a horizontal portion and an arced portion connected with the horizontal portion. The lever has a pair of locating portions received in the locating slots, a driving portions defined between the locating portions, and a handling portion bending vertically from one of the locating portions. The clip has a pair of acting portions respectively received in the locating grooves and a driving hook defined at a free end thereof. The acting portions of the clip can only rotate in the arced portions of the locating grooves when the clip rotates from a vertical position to a horizontal position and can only slide in the horizontal portions of the locating grooves when the driving portion of the lever drives the driving hook of the clip.

DESCRIPTION OF THE PREFERRED EMBODIMENTS

Reference will now be made in detail to the preferred embodiments of the present invention.

Figure 1:
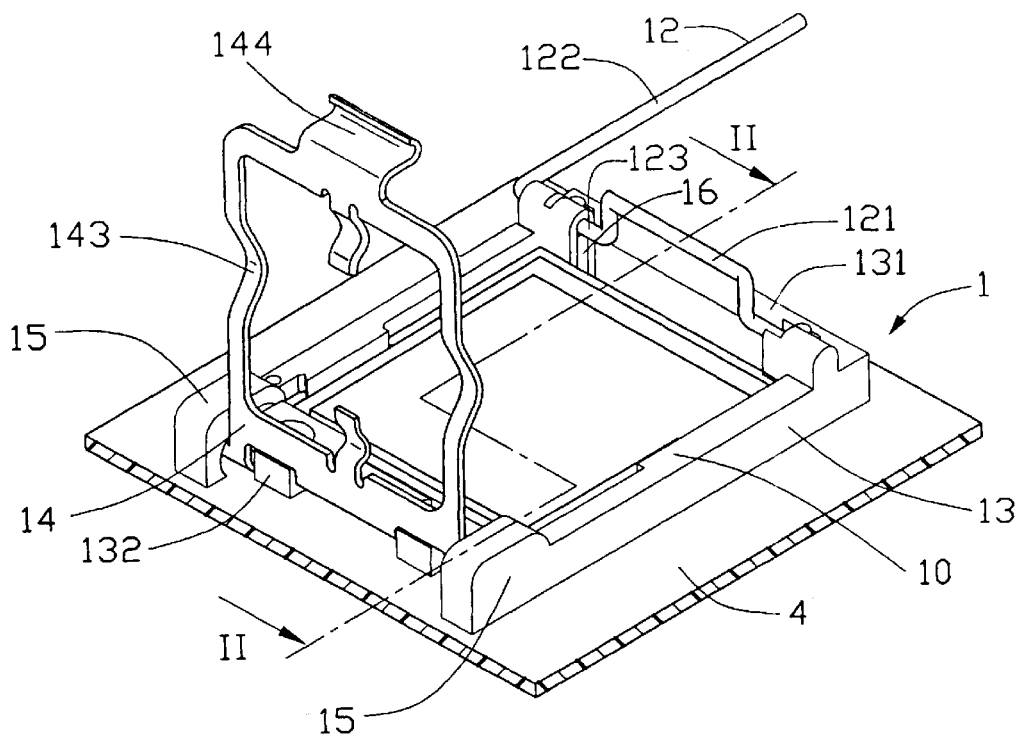
FIG. 1 is a perspective view of a land grid array connector assembly in accordance with a first embodiment of the present invention showing a clip of the connector assembly being at a vertical position.
Figure 2:
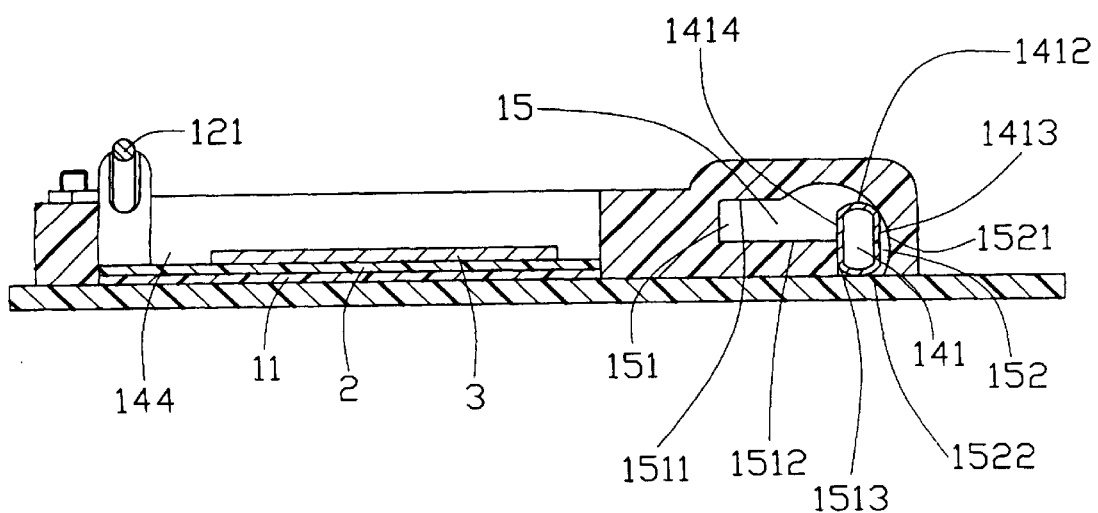
FIG. 2 is cross-sectional view, taken along line II—II of FIG. 1.

Referring to FIGS. 1 and 2, a land grid array connector assembly 1 in accordance with a first preferred embodiment of the present invention includes a socket 11 and a fastening device 10 surrounding the socket 11. THE socket has a plurality of land grid array contacts defined therein. The socket 11 and the fastening device 10 are mounted to a printed circuit board (PCB) 4. The fastening device 10 comprises an insulative frame 13, a lever 12 and a metal clip 14 respectively assembled to opposite sides of the frame 13. A central process unit (CPU) 2 together with a copper plate 3 is assembled on the socket 11 and received in the frame 13.

The frame 13 has a pair of spaced locating slots 16 settled at a first side 131 thereof. The lever 12 has a pair of locating portions 123 respectively received in the locating slots 16 thereby retaining the lever 12 to the frame 13. The lever 12 also has a driving portion 121 defined between the two locating portions 123 and a handling portion 122 bending vertically from one of the locating portions 123.

The frame 13 also has a pair of spaced guiding grooves 15 settled at a second side 132 opposite to the first side 131. Each groove 15 comprises a horizontal portion 151 and an arced portion 152 connected with the horizontal portion 151.

The horizontal portion 151 is positioned at an inner side of the groove 15 and defines a first horizontal bottom surface 1512 and a top surface 1511 parallel to the bottom surface 1512. The arced portion 152 is positioned at an outer side of the groove 15 and defines a second horizontal bottom surface 1522 (a top surface of the PCB 3) and an arced top surface 1521. The first bottom surface 1512 is above the second bottom surface 1522 at a horizontal direction thereby a sidestep 1513 being formed therebetween. The arced top surface 1521 is connected with the horizontal top surface 1511 and a top of the arced portion 1521 is beyond the height of top surface 1511 at a vertical direction.

The clip 14 has a pair of acting portions 141 respectively received in the guiding grooves 15. Each acting portion 141 has a top surface 1413, a bottom surface 1414 parallel to the top surface 1413, and a pair of arced side surface respectively connecting the two ends of the top and bottom surfaces 1413 and 1414. The clip also has a pair of spaced pressing arms 143 respectively extending out from the two acting portions 141 and a driving hook 144 at a free end thereof jointing the two pressing arms 143.

Figure 3:
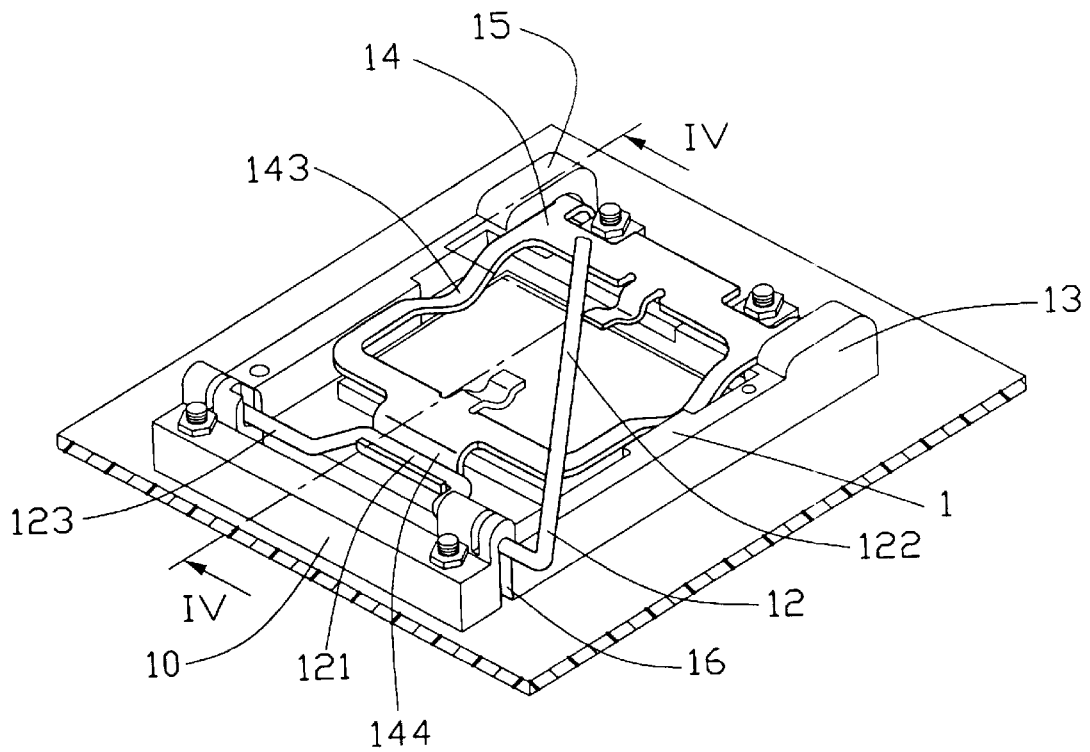
FIG. 3 is another perspective view of the land grid array connector assembly of FIG. 1 showing the clip of the connector assembly being at a horizontal position.
Figure 4:
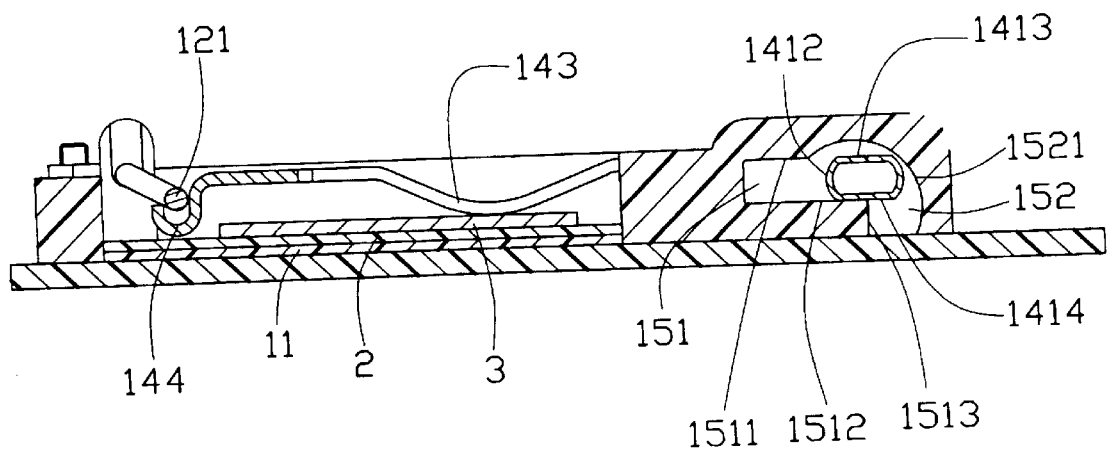
FIG. 4 is cross-sectional view, taken along line IV—IV of FIG. 3.
Figure 5:
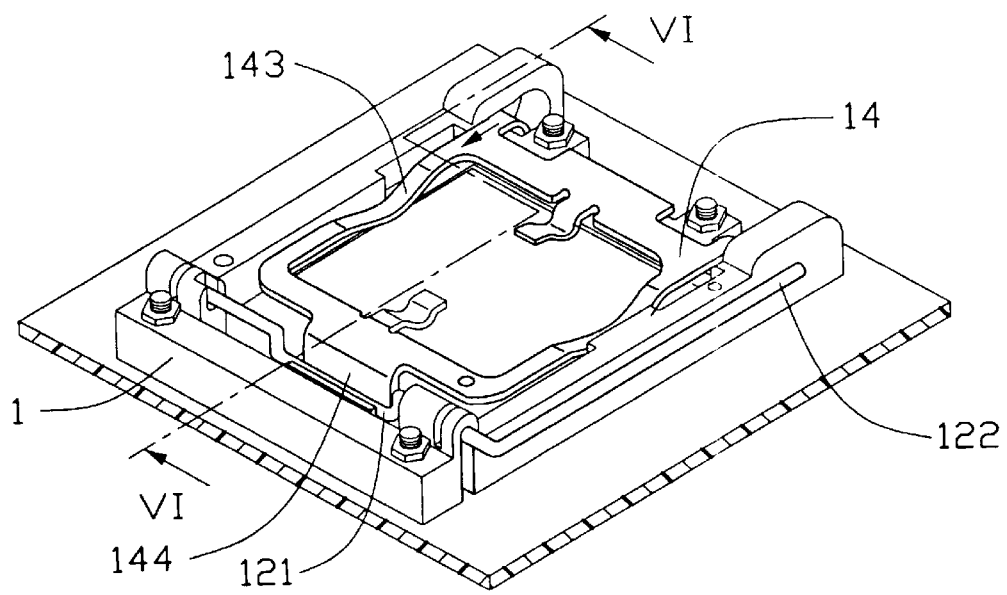
FIG. 5 is another perspective view of the land grid array connector assembly of FIG. 1 showing the clip of the connector assembly pressing a CPU in the connector assembly.
Figure 6:
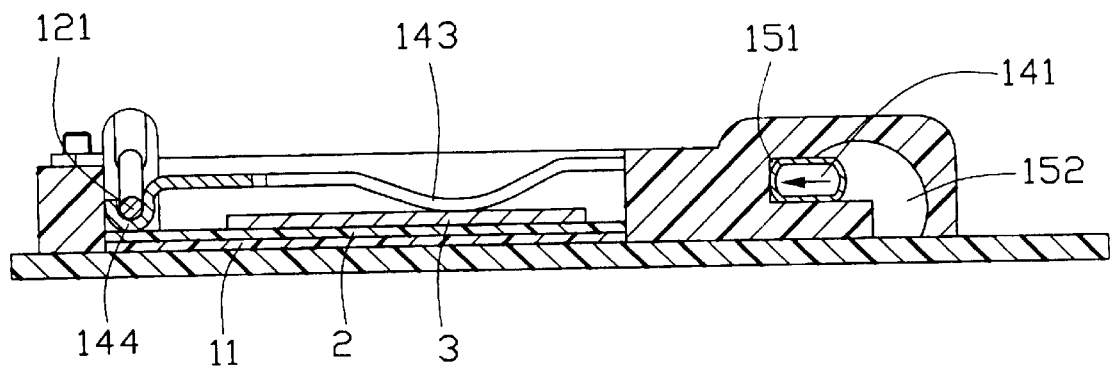
FIG. 6 is cross-sectional view, taken along line VI—VI of FIG. 5.

In use, referring to FIGS. 1 and 2 again, the clip is firstly set up vertically to put the CPU 2 and the copper plate 3 into the frame 13 for assembling on the socket 11, and the lever 12 is at an opening position with the handling portion 122 being at a horizontal place and the driving portion 121 being at its highest point. At this position, the acting portions 141 of the clip 14 are located in the arced portions 152 of the locating grooves 15 with the bottom surfaces 1414 of the acting portions 141 abutting against the sidesteps 1513 and one of the arced side surfaces 1412 resisting the second bottom surfaces 1522 of the arced portions 152. Referring to FIGS. 3 and 4, the clip 14 is rotated to a close position with the pressing arms 143 abutting against the copper plate 3. At this position, the acting portion 141 rotates pivotally around the sidestep 1513 until the bottom surface 1414 of the acting portion 141 touching the first bottom surface 1512 of the locating grooves 15. Due to the sidestep 1513 stops the acting portions 141 from sliding along the arced portion 152 during the rotation of the acting portions 141, the driving portions 121 of the lever 12 can be rightly engaged into the driving hooks 144 of the clip 14 when the lever 12 is rotated to its vertical position. Referring to FIGS. 5 and 6, the clip 14 is at a pressing position with the pressing arms 143 tightly pressing the copper plate 3. The lever 12 is at a final close position with the handling portions 122 of the lever 12 driving the driving hooks 144 of the clip 14 sliding along the copper plate 2 and pressing the driving hooks 144 downwardly. At this position, the acting portions 141 slide along the first bottom surface 1512 of the horizontal portion 151 and are prevented from rotation by the top surface 1511 of the horizontal portion 151.

Figure 7:
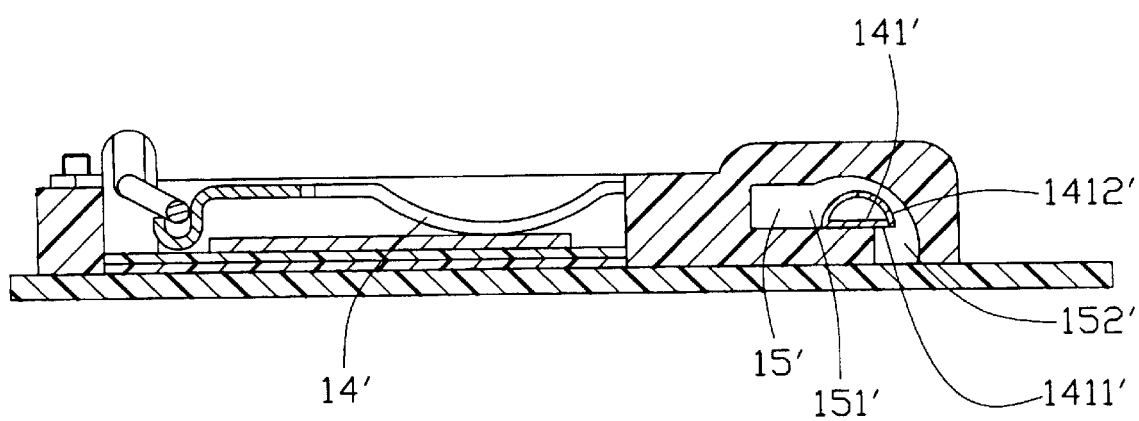
FIG. 7 is a cross-sectional view of a land grid array connector assembly in accordance with a second embodiment of the present invention showing a clip of the connector assembly being at a horizontal position.
Figure 8:
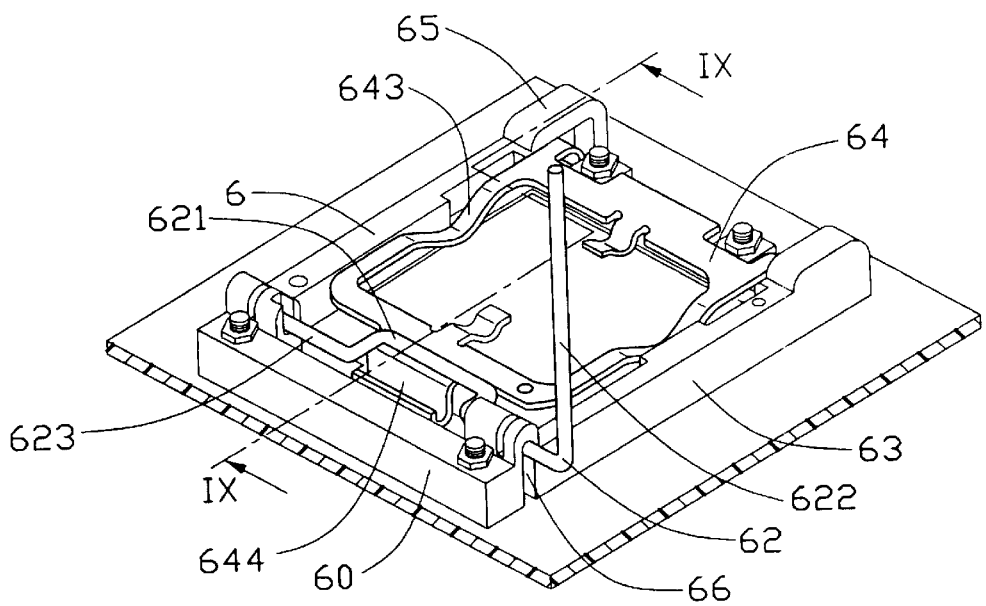
FIG. 8 is an exploded view of a conventional land grid array connector assembly.
Figure 9:
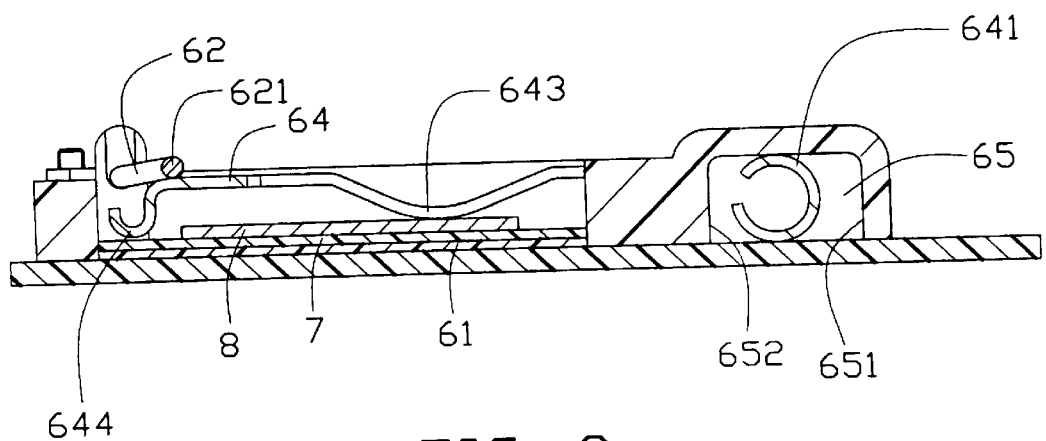
FIG. 9 is a cross-sectional view, taken along line IX—IX of FIG. 8.

FIG. 7 shows a second embodiment of a clip 14' of the present invention. The acting portion 141' of the clip 14' presents a substantially semicircular figuration that has a straight bottom surface 1411' and an arced top surface 1412'. The acting portion 141' can only rotate in an arced portion 152' of a locating groove 15' and can only slide in a horizontal portion 151' of the locating groove 15', such that the clip 14' is always insured in true position even if it is rotated to different places.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A connector assembly comprising:
   a socket;
   a fastening device including a frame surrounding the socket, a lever pivotally mounted to a first side of the frame, and a metal clip movably mounted to an opposite second side of the frame;
   the frame including a pair of locating slots defined at opposite ends of the first side and a pair of locating grooves defined at opposite ends of the second side, each groove having a horizontal portion and an arced portion connected with the horizontal portion;
   the lever having a pair of locating portions received in the locating slots, a driving portion defined between the locating portions, and a handling portion bent vertically from one of the locating portions;
   the clip having a pair of acting portions respectively received in the locating grooves and a driving hook defined at a free end thereof; and
   wherein the acting portions are rotatable in the arced portions of the locating grooves and, when the driving hook is driven by the driving portion of the lever, the acting portions are slidable in the horizontal portions of the locating grooves.

2. The connector assembly as claimed in claim 1, wherein the horizontal portion of each locating groove defines a first horizontal bottom surface and a top surface parallel to the first bottom surface, the arced portion of each locating groove defines a second horizontal bottom surface and an arced top surface, and the first bottom surface is above the second bottom surface with reference to a horizontal direction thereby forming a sidestep therebetween, the arced top surface being connected with the horizontal top surface and a top of the arced portion being beyond the height of the top surface with reference to a vertical direction.

3. The land grid array connector assembly as claimed in claim 2, wherein each acting portion of the clip comprises a top surface, a bottom surface parallel to the top surface, and a pair of arced side surfaces respectively connecting the top and the bottom surfaces.

4. The land grid array connector assembly as claimed in claim 2, wherein each acting portion of the clip has a substantially semicircular surface.

5. The land grid array connector assembly as claimed in claim 2, wherein the clip has a pair of pressing arms extending from the two acting portions and the driving hook at a free end thereof jointing the two pressing arms.

6. A fastening device comprising:
   a frame for surrounding a land grid array socket, the frame having a first side and a second side opposite to the first side, a pair of locating slots at the first side and a pair of locating grooves at the second side, each groove having a horizontal portion and an arced portion connected with the horizontal portion;
   a lever pivotally mounted to the first side of the frame;
   a metal clip movably mounted to the second side of the frame, the clip having a pair of acting portions respectively received in the locating grooves of the frame and a driving hook defined at a free end thereof, the acting portions being capable of rotating in the arced portions of the locating grooves and being capable of sliding in the horizontal portions of the locating grooves.

7. The fastening device as claimed in claim 6, wherein the lever has a pair of locating portions received in the locating slots, a driving portion defined between the locating portions, and a handling portion bent vertically from one of the locating portions, the driving portions driving the driving hook of the clip.

8. The fastening device as claimed in claim 7, wherein the clip has a pair of pressing arms extending from the two acting portions and a driving hook jointing the two pressing arms.

9. The fastening device as claimed in claim 6, wherein the horizontal portion of each locating groove define a first horizontal bottom surface and a top surface parallel to the first bottom surface, the arced portion of each locating groove defines a second horizontal bottom surface and an arced top surface, and the first bottom surface is above the second bottom surface with reference to a horizontal direction thereby forming a sidestep therebetween, the arced top surface being connected with the horizontal top surface and a top of the arced portion is beyond the height of top surface with reference to a vertical direction.

10. The land grid array connector assembly as claimed in claim 9, wherein each acting portion of the clip comprises a top surface, a bottom surface parallel to the top surface, and a pair of arced side surface respectively connecting the top and the bottom surfaces.

11. A fastening device comprising:

a frame;

a lever pivotally mounted on one end of the frame about a pivot;

a metal clip moveably mounted on the other end of the frame;

said metal clip defining an acting portion cooperating with a structure of said other end of the frame so as to have said acting portion be able to move along said structure and result in a rotation plus sliding movement of said metal clip relative to said frame;

said metal clip defining a driving hook opposite to said acting portion, said lever defining a driving portion opposite to said pivot; wherein when both said metal clip and said lever are arranged in a horizontal position with the driving hook engaging the driving portion, the structure of the frame prohibits the acting portion from rotation.

\* \* \* \* \*